United States Patent [19]
Snyder

[11] Patent Number: 5,636,059
[45] Date of Patent: Jun. 3, 1997

[54] CYLINDRICAL MICROLENS EXTERNAL CAVITY FOR LASER DIODE FREQUENCY CONTROL

[75] Inventor: James J. Snyder, Sequel, Calif.

[73] Assignee: Blue Sky Research, Incorporated

[21] Appl. No.: 386,312

[22] Filed: Feb. 8, 1995

[51] Int. Cl.$^6$ .............................. G02B 13/08; G02B 13/18
[52] U.S. Cl. ............................ 359/668; 359/717; 372/18
[58] Field of Search ................................. 359/668, 717; 372/18

[56] References Cited

U.S. PATENT DOCUMENTS

| | | | |
|---|---|---|---|
| 4,253,735 | 3/1981 | Kawamura et al. | 359/668 |
| 5,095,386 | 3/1992 | Scheibengraber | 359/668 |
| 5,161,064 | 11/1992 | Clark et al. | 359/668 |

*Primary Examiner*—Scott J. Sugarman
*Attorney, Agent, or Firm*—Joseph Smith

[57] ABSTRACT

This invention relates to a simple, compact, and robust, cylindrical microlens external cavity for laser diode frequency control. The microlens system makes possible a tunable laser diode that utilizes an orthogonal pair of collimating microlenses to form a short external cavity for longitudinal mode and frequency control. The resulting system generates a circular, collimated beam of single frequency, tunable laser radiation. A cylindrical microlens collimator has a powered surface that semi-collimates (i.e., collimates in one axis only) the light from a laser diode. This powered surface is placed so as to be the surface closest to the laser facet. A second lens surface opposite the powered surface, is located in the semi-collimated beam is planar. The second surface of the lens is flat and has a reflective coating. Hence, it provides feedback that is refocused (in one axis) onto the laser aperture. This leads to efficient light coupling back into the laser even if the reflectivity of the second surface is relatively low, and allows the use of lasers with only a single optical output. In another embodiment, a second microlens is used to circularize the beam from the first microlens and the pair of microlenses is mounted onto a translator so as provide frequency tuning of the laser diode.

4 Claims, 14 Drawing Sheets

CYLINDRICAL MICROLENS EXTERNAL CAVITY FOR LASER DIODE FREQUENCY CONTROL

CROSS-REFERENCE TO RELATED PATENTS

This invention is related to U.S. patent application Ser. No. 08/020584, pending filed Feb. 22, 1993, entitled MICROLENS ASSEMBLIES AND COUPLERS. The microlenses used in the present invention are pulled lenses constructed according to the methods described in application Ser. No. 07/591,462 entitled METHOD AND FABRICATION OF CYLINDRICAL MICROLENSES OF SELECTED SHAPE, by James J. Snyder and Thomas M. Baer now U.S. Pat. No. 5,080,706. Other related applications include application Ser. No. 07/591,409, entitled LASER DIODE ASSEMBLY INCLUDING A CYLINDRICAL LENS, filed Sep. 18, 1990 by James J. Snyder and Patrick Reichert; now U.S. Pat. No. 5,081,639 and application Ser. No. 07/697,974, entitled MICROPTIC LENSES, by James J. Snyder now U.S. Pat. No. 5,181,224. All of the above patent applications are hereby incorporated by reference.

BACKGROUND OF THE INVENTION

This invention relates to a simple, compact, and robust, cylindrical microlens external cavity for laser diode frequency control. The microlens system makes possible a tunable laser diode that utilizes an orthogonal pair of collimating microlenses to form a short external cavity for longitudinal mode and frequency control. The resulting system generates a circular, collimated beam of single frequency, tunable laser radiation.

Keywords: tunable laser diode, external cavity, microlens, laser diode frequency control, optical feedback.

A typical edge emitting laser diode consists of a crystal with polished end facets and electrodes to supply the bias. The reflectivity of the uncoated facets, due to the high index of refraction of the diode material, is of the order of 30%. This low reflectivity, coupled with the high gain necessary to overcome such losses and allow the production of coherent light means that any light which scatters or reflects from external optical elements (or even the laboratory walls) will find its way back into the laser and affect its operation. Depending on its magnitude and phase, light which has been fed back into a laser diode may degrade its output by causing multimode operation or a broadening of its linewidth, or it may enhance single mode operation and narrow the linewidth. (See G. P. Agrawal and N. K. Dutta, Long-Wavelength Semiconductor Lasers(Van Nostrand Reinhold, New York, 1986))

Figure 1A:
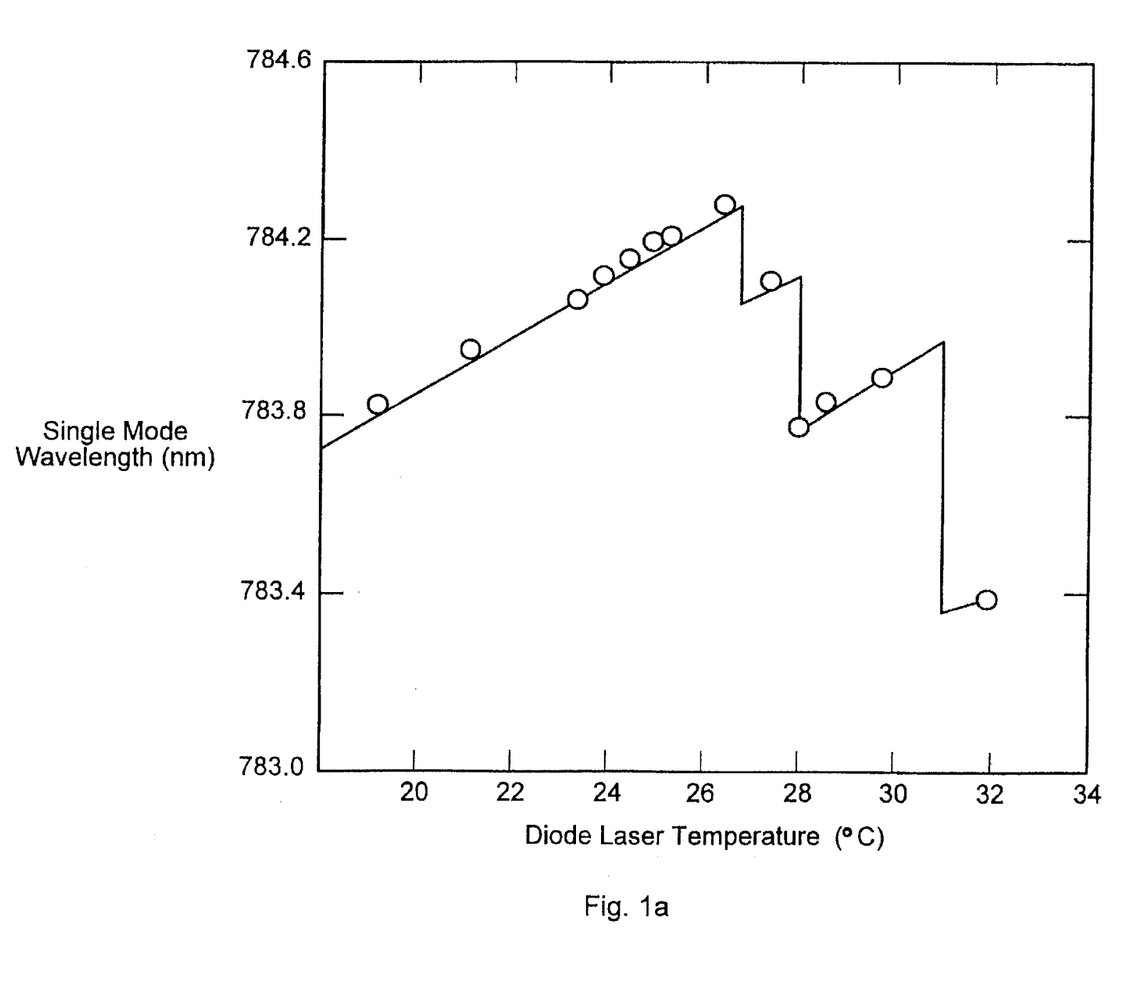
FIG. 1a shows a typical temperature tuning curve for a laser diode.
Figure 1B:
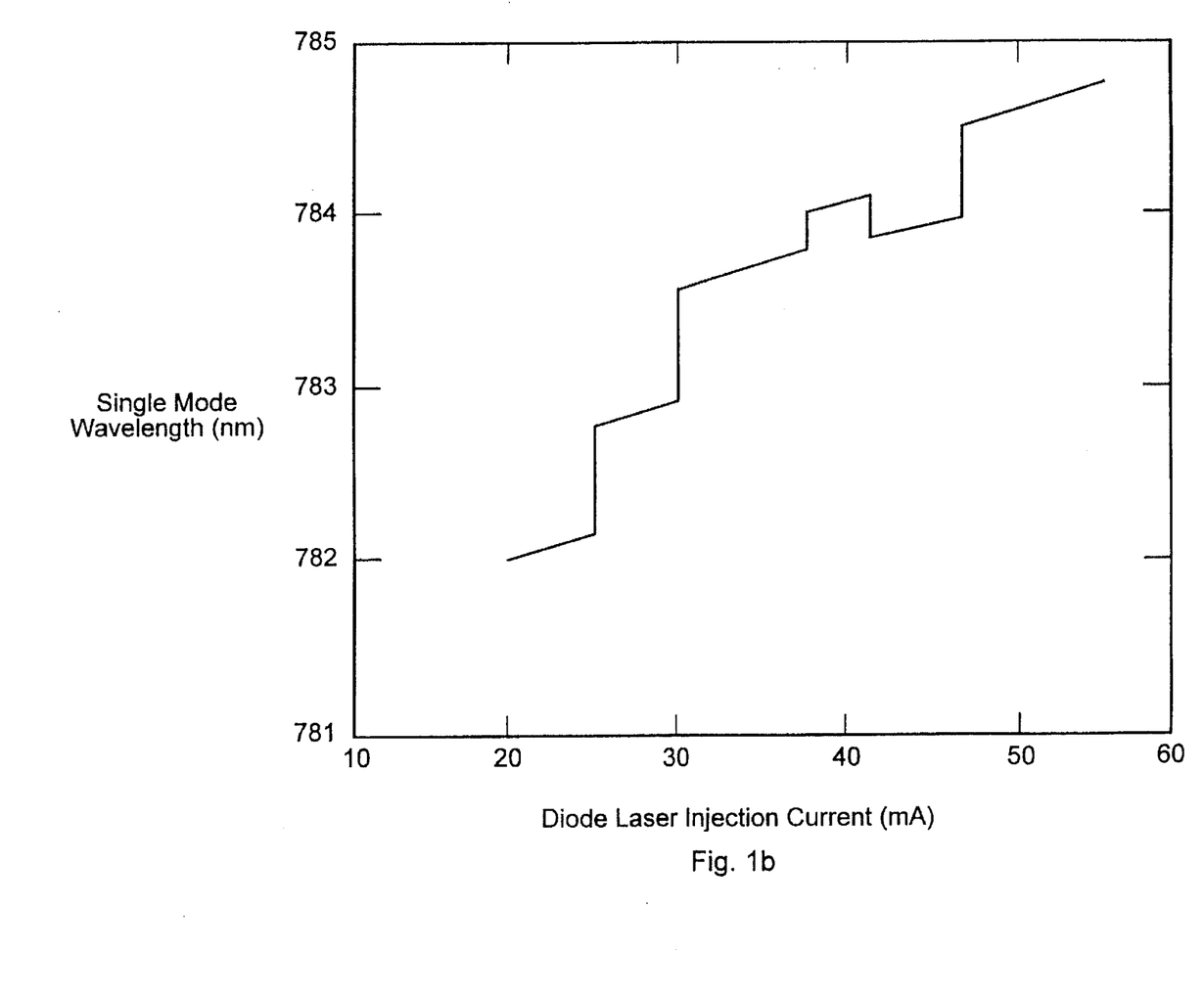
FIG. 1b shows a typical tuning curve for a laser diode as a function of current.

Most laser diodes can be tuned over a substantial range by changing either the temperature or the drive current. However, the tuning is typically not smooth and not continuous. An example of the dependence of a diode's output wavelength as a function of the current or the temperature is shown in FIG. 1a and FIG. 1b. (See J. C. Camparo, "The laser diode in atomic physics," Rev. Sci. Instrum. 62, 1–20(1991)). FIG. 1a shows a typical temperature tuning curve for a laser diode. A single mode of the laser can tune as much as 0.4 nm by changing the temperature before "hopping" to another longitudinal mode. Similarly, as shown in FIG. 1b, the wavelength of the laser can be tuned by varying the current. In that case the wavelength can change by about 0.1 nm before mode hopping. While there are regions in which the wavelength changes smoothly, in between these regions are abrupt changes which correspond to longitudinal mode "hops" described above. For the case of temperature tuning these hops are caused by the faster change of the laser's gain curve with temperature than its change in mode frequency (due to the change in optical length). Unfortunately for users of laser diodes, the tuning range without external feedback will have substantial gaps; wavelength bands the diode cannot access. Although there are other, more complex laser diodes, such as distributed feedback (DFB) lasers, which are intrinsically single mode and can be tuned Continuously over wider spectral regions, they are more expensive and not readily available at most laser diode wavelengths.

Without optical feedback, the laser can be current-tuned as much as 50 GHz (0.1 nm) as long as its frequency is not near a mode hop and the accompanying variation in optical power is acceptable. The operating wavelength can be coarsely tuned by as much as 10 or 20 nm by changing the temperature. Thus with a combination of current and temperature tuning, one might expect that a laser diode can be tuned to any wavelength that falls within its gain bandwidth.

In practice, because of the mode hops, not every laser will operate at a particular desired wavelength. It has been experimentally shown, however, that optical feedback can suppress mode hops in a laser diode's tuning curve. (See A. Hemmerich, et al "Optically stabilized narrow linewidth semiconductor laser for high resolution spectroscopy," Opt. Comm. 75, 118–122(1990)) It does so by enhancing the gain conditions of one of the longitudinal modes over the others. It is therefore generally accepted that some form of optical feedback mode control is necessary to obtain an all-purpose tunable laser diode. (See C.E. Wieman and L. Hollberg, "Using laser diodes for atomic physics," Rev. Sci.Instrum. 62, 1–20(1991)).

A common way of ensuring single mode operation in a laser diode is to create a short external cavity by placing an optical surface 100 microns or less from the laser output facet. This has been done both with a flat piece of glass and with a GRIN lens. (See G. P. Barwood, et al, "Longitudinal mode control in laser diodes," Meas. Sci. Technol. 3, 406–410(1991)) Short external cavities based on experimental lasers in which both outputs of the laser are accessible have also been investigated. (See D. T. Casidy et al, "Short-external-cavity module for enhanced single mode tuning of InGaASP and AlGaAs semiconductor laser diodes," Rev. Sci.Instrum. 62, 2385–2388(1991)) In this case a flat or spherical mirror has been employed to reflect the light exiting one end back into the laser while leaving the other output unobstructed. However, such lasers are not always easily obtainable. Also, many commercially available laser diodes are provided in a package in which only one output is accessible.

Prior published work on laser diodes with short external cavities based on graded index (GRIN) lenses has reported a frequency pulling range of 2 GHz. The GRIN lens external cavity provided sufficient control to allow continuous temperature tuning of the laser diode over a wavelength range of 2 nm with the external cavity length fixed.

The value of the short external cavity concept is that it can be used in conjunction with broad-band tuning techniques either for simple longitudinal mode selection, or alternatively as a fine control for sweeping or dithering the frequency of the laser. However, short external cavities based on thin glass plates or on GRIN lenses have low efficiency because the light reflected back to the laser is strongly divergent. To compensate for the geometric losses of the cavity due to divergence, the reflectivity of the surface must be high, so the useable optical power is low.

What is needed is a system which provides sufficient feedback but transmits the major fraction of the output, so that the laser can be tuned over a substantial frequency range while avoiding mode hopping.

BRIEF DESCRIPTION OF THE DRAWINGS

FIG. 3b shows a side view of the microlens pair illustrated in FIG. 3a.

FIG. 3c shows a top view of the microlens pair illustrated in FIG. 3a.

FIG. 5 is a plot of the calculated aberration over the laser beam after it exits the microlens pair of FIG. 3a.

SUMMARY OF THE INVENTION

In accordance with preferred embodiments of the invention, a short external cavity is produced using a microlens to collimate the light before it reaches a plane feedback surface (the backside of the microlens). Hence, the coupling efficiency is much higher than with previous external cavities. The cavity reflectivity can be commensurately reduced, thereby increasing the available output power. Thus the external microlens cavity approach to laser mode control offers the advantages of a strongly fed back, short external cavity as well as higher output power and a diffraction-limited, collimated, circular beam.

Results for three different microlens cavities with lengths ranging from 266 μm to 1.015 mm, and with reflectivities of approximately 1%, 6%, and 35% on the plane feedback face favor the shortest cavity length and highest reflectivity. For this combination, continuous tuning has been demonstrated over approximately 38 GHz. This tuning range, it is believed, substantially exceeds the best frequency pulling range previously achieved.

In particular, a laser is provided which is stabilized against mode hopping, which includes a laser diode having an optic axis and first and second axes orthogonal to said optic axis. A first cylindrical microlens is spaced apart from the laser diode and configured for collimating radiation emitted by the laser diode on the first axis and having a flat surface for reflecting a portion of the radiation from the laser diode back along the optic axis toward the laser diode, wherein the first cylindrical microlens has a longitudinal axis which is orthogonal to the optic axis, and wherein the first cylindrical microlens has a first optical surface and a second optical surface opposite the first optical surface, wherein the first optical surface is convex and is oriented for receiving radiation from the laser diode and wherein said second optical surface is the flat surface and is oriented for receiving radiation from the first optical surface, and wherein the second surface has a reflective coating.

Also provided is a tunable laser. The tunable laser is made up of a laser diode having an optic axis and first and second axes orthogonal to the optic axis, a microlens assembly, and a translator element. The microlens assembly includes a first cylindrical microlens configured for collimating radiation emitted by the laser diode on the first axis and having a flat surface for reflecting a portion of the radiation from the laser diode back along the optic axis toward said laser diode; a second cylindrical microlens spaced apart from said first microlens, orthogonal thereto, and configured for circularizing radiation incident from said first microlens; and a holder for holding the first cylindrical microlens and the second cylindrical microlens in the spaced apart arrangement to accomplish the circularization by the second microlens. The translation element is coupled to the laser diode and to the microlens assembly such that the microlens assembly can be translated along the optic axis relative to laser diode.

In a preferred mode of the tunable laser, the first cylindrical microlens has a longitudinal axis which is orthogonal to the optic axis, and has a first optical surface and a second optical surface opposite the first optical surface, wherein the first optical surface is convex and is oriented for receiving radiation from the laser diode and wherein the second optical surface is the flat surface and is oriented for receiving radiation from the first optical surface, and wherein the second surface has a reflective coating.

Also, in a preferred mode, the holder in the microlens assembly of the tunable laser is made up of an annulus with two orthogonal grooves having longitudinal axes passing through the open portion of the annulus, the grooves being of different depths, and configured such that when the first microlens is placed in one groove and the second microlens is placed in the other groove, the first and second microlenses are spaced apart.

DESCRIPTION OF THE PREFERRED EMBODIMENTS

A central concept behind the Microlens Tunable Laser diode is to use collimating cylindrical microlenses both to correct the aberrations of the output beam and to form a short external cavity to control the diode's optical frequency. In particular, light retroreflected from the microlens back into the laser will force the laser to operate in a single longitudinal mode as it is tuned. The exact laser frequency depends on the phase of the fedback light, which can be varied by translation of the lens' position along the optical axis. Therefore the feedback can be used to "pull" the frequency of the output light over some fraction of the free spectral range (FSR) of the laser diode cavity. The tuning range achievable by frequency pulling depends on the strength of the feedback.

In many applications the primary function of an external microlens cavity may be simple longitudinal mode control, i.e., the prevention of mode hops as the laser is tuned by other means over a wide spectral region. Since the external microlens cavity length can be changed quickly (eg. using PZT translators), however, it also provides the means to sweep quickly over a limited spectral region, such as a molecular absorption line. This capability can be combined with a slow, broad-band tuning technique, such as temperature-tuning, to create a simple, economical, spectroscopic probe.

Figure 2:
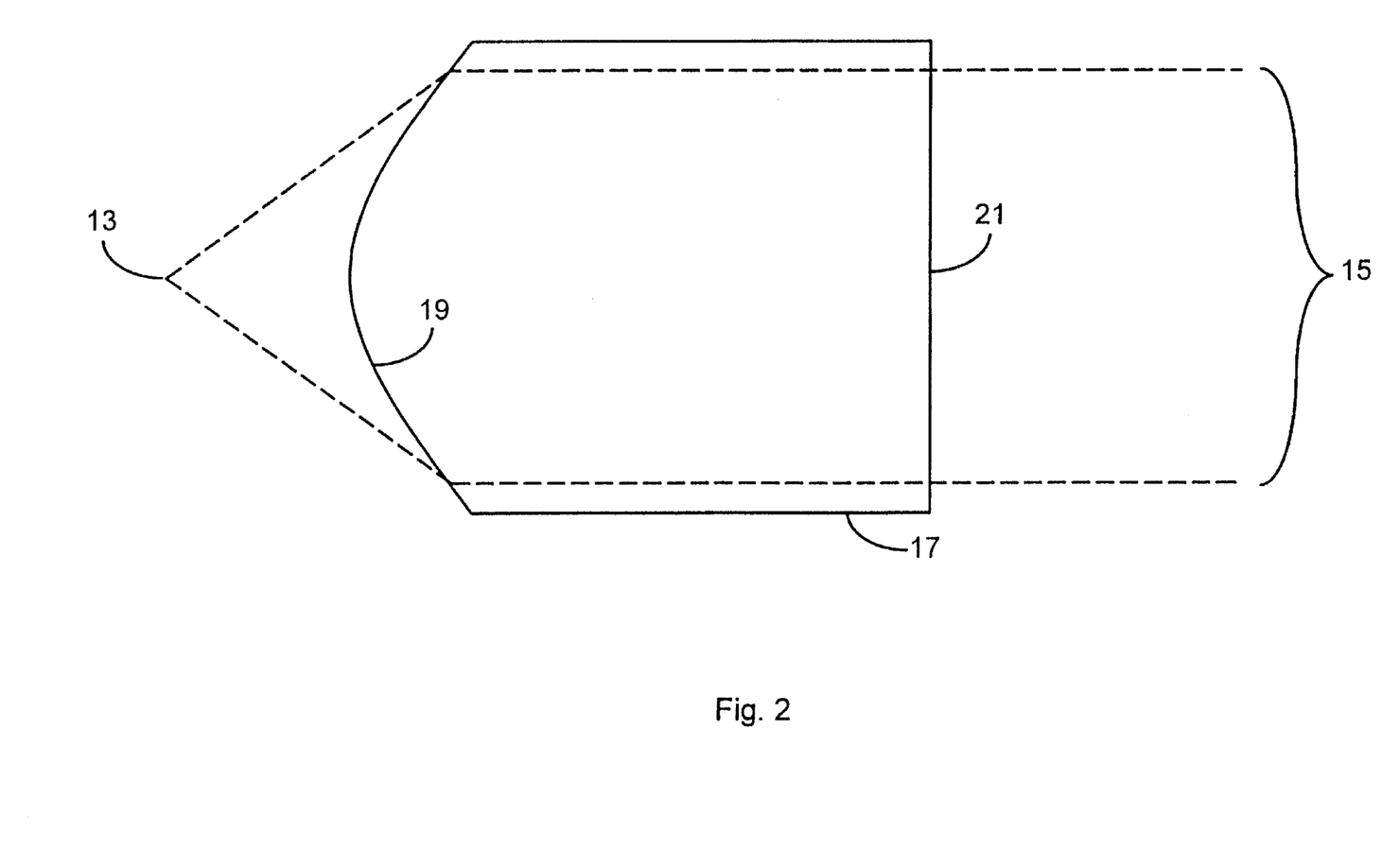
FIG. 2 shows a collimating microlens in accordance with the invention.

As illustrated in FIG. 2, in a cylindrical microlens collimator 17, the powered surface 19 that semi-collimates (i.e., collimates in one axis only) the light can be designed to be the surface closest to the laser facet 13. (The figure illustrates the effect of the microlens on the marginal ray 15 radiating from the laser diode.) The second lens surface 21, located in the semi-collimated beam is planar. If the second surface of the lens is reflective, it provides feedback that is refocused (in one axis) onto the laser aperture. This leads to efficient light coupling back into the laser even if the reflectivity of the second surface is relatively low, and allows the use of lasers with only a single optical output.

Figure 3A:
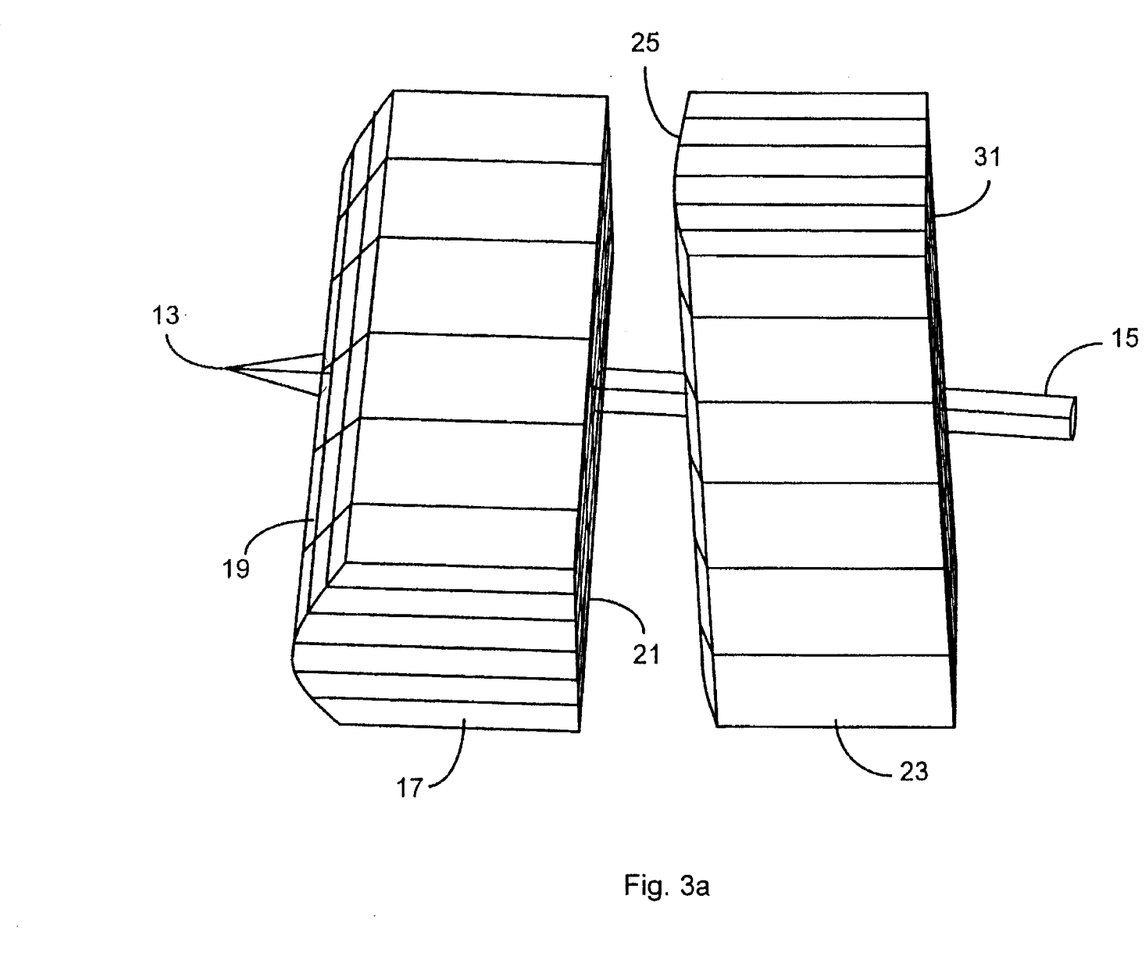
FIG. 3a shows a three dimensional view of a pair of crossed microlenses in accordance with the invention.

In another preferred embodiment, a pair of crossed cylindrical microlens collimators 17 and 23, such as those illustrated in FIG. 3a, are mounted in front of a single-transverse-mode laser diode. Each microlens semi-collimates one orthogonal axis of the output radiation, and the combination symmetrizes (i.e. circularizes) the beam as well. For the optimum design, the flat second surface 21 of the first microlens is coated to supply feedback to the laser diode and all other microlens surfaces are typically AR coated. Although the light reflected from the first plane surface 21 is only collimated in one axis, and thus requires higher reflectivity to compensate for the divergence of the uncollimated axis, the use of this surface to provide feedback results in the shortest cavity length. As is shown below, the shortest cavity length provides the greatest continuous tuning range. The ray trace illustrated by the marginal ray 15 shows the circularization and collimation of the beam by the microlens pair.

In contrast to conventional lenses used to collimate the rapidly diverging output of a laser diode, the microlens collimators developed by Blue Sky Research, Inc. of San Jose, Calif. collect more than 90% of the laser output and produce a circular, collimated, diffraction limited beam.

Figure 3B:
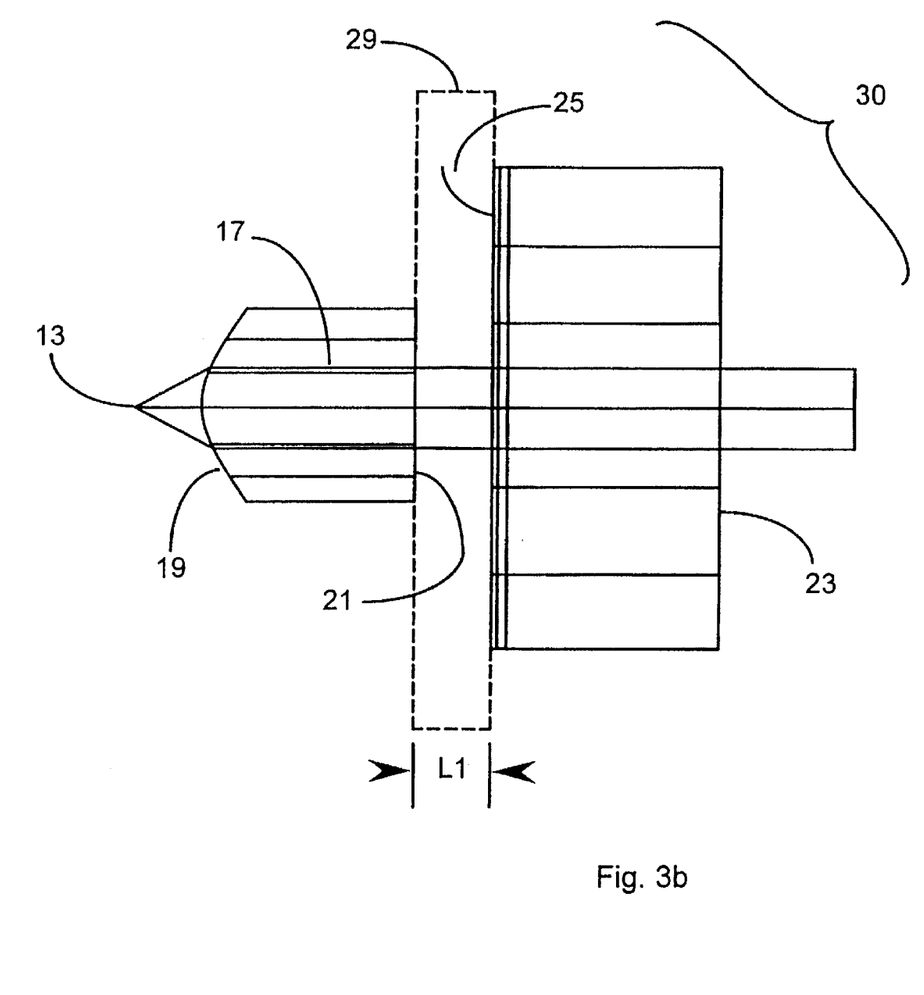
Figure 3C:
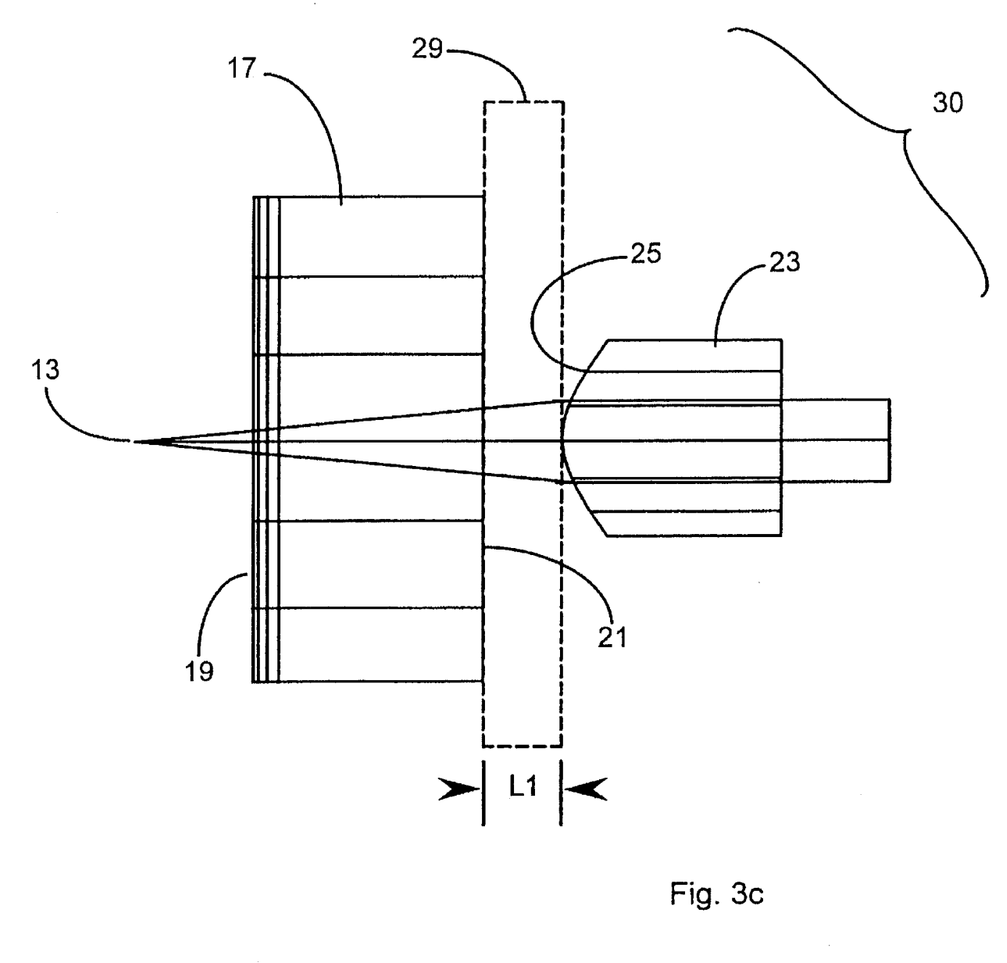

Based on experiments described below, a microlens pair 30 was designed to work specifically with a 780 nm Sharp LT024MDO single mode laser diode. This particular diode was chosen for the initial experiments because its output facet is AR-coated to reduce its reflectivity, which improves its suitability for controlling with an external cavity. Orthogonal views of the microlens design are shown in FIGS. 3b and 3c, which represent the Y-Z plane and the X-Z plane, respectively. The first microlens 17 collimates the fast axis, which diverges with a half angle of 29°. The second microlens 23 collimates the slow axis which diverges at 10°. The powered surface 25 of the second microlens is positioned to provide for a circular output beam. Optical feedback is provided by the second surface 21 of the first microlens which is coated to provide a reflectivity of about 35%. Surface 19 of the first microlens 17 has a hyperbolic shape that collimates the source radiation without aberration. Its paraxial focal length is 50 µm, its radius of curvature is 30 µm, and its conic constant is −2.59. The second microlens 23 is similar, with a paraxial focal length of 97 µm, a radius of curvature of 159 µm, and a conic constant of −2.48. The spacing L1 between the microlenses is 75 µm. An annular spacer 29, e.g. a precision ground washer, is typically used to maintain the spacing L1 between the microlens pair and in the preferred mode the microlens pair is glued to the spacer 29. The spacer also provides a means of handling the lenses as a unit.

Figure 4:
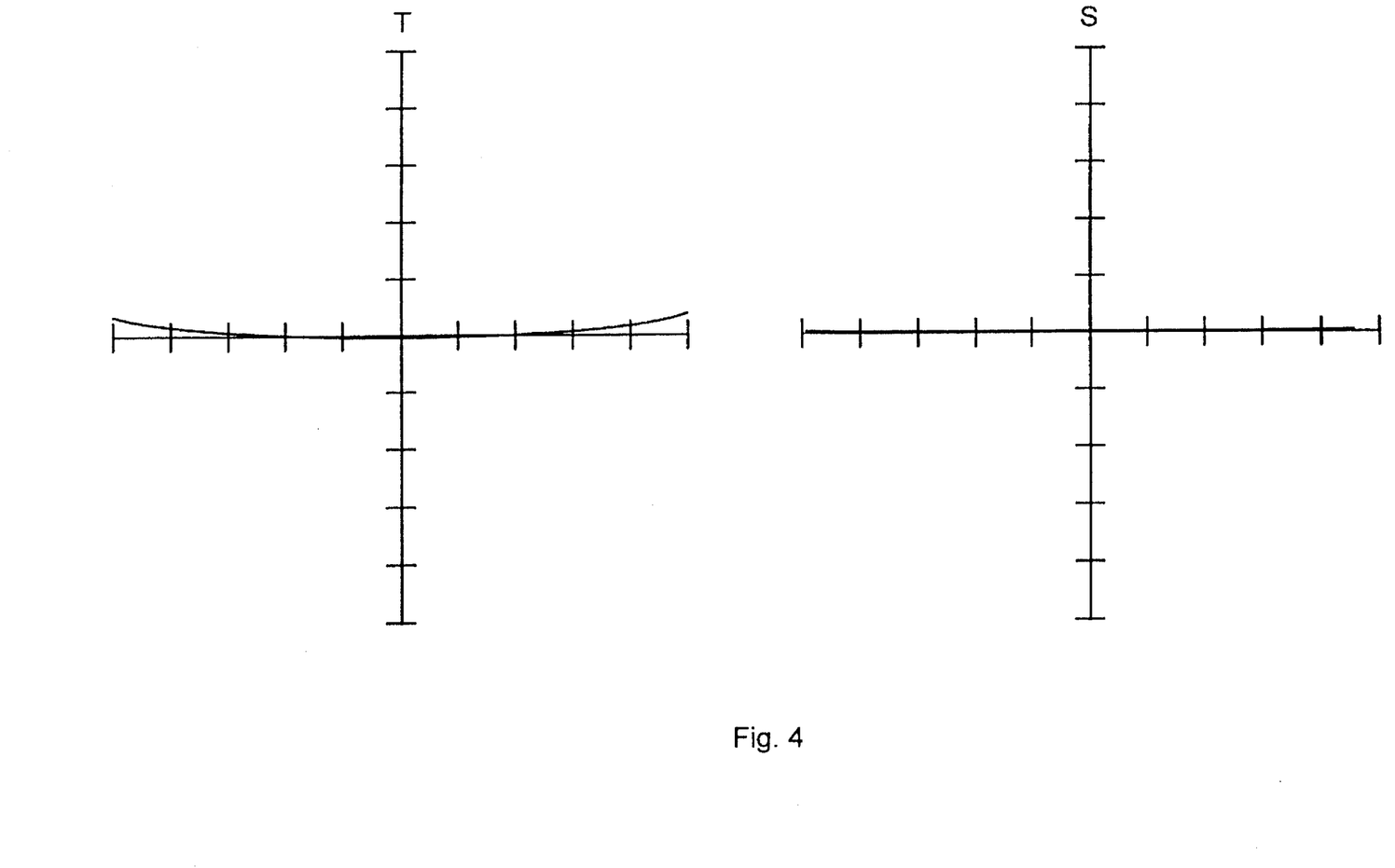
FIG. 4 is a graph showing the optical path differences for the microlens pair shown in FIG. 3a, for both the fast and slow axis.

The calculated optical path difference for the microlens pair is shown in FIG. 4. In this figure, the path difference in the fast axis (Y-Z plane) is labeled "T", and is the curve on the left. The slow axis path difference is labeled "S" and is shown on the right. The vertical scale for both curves is 0.004 waves full scale. The design shows that aberrations are insignificant relative to the diffraction limit (¼ wave). The vertical scale is 1/250 waves full scale. The left plot shows the fast axis of the laser diode. The right plot shows the slow axis. Aberrations in the slow axis are below the resolution of the figure.

Figure 5:
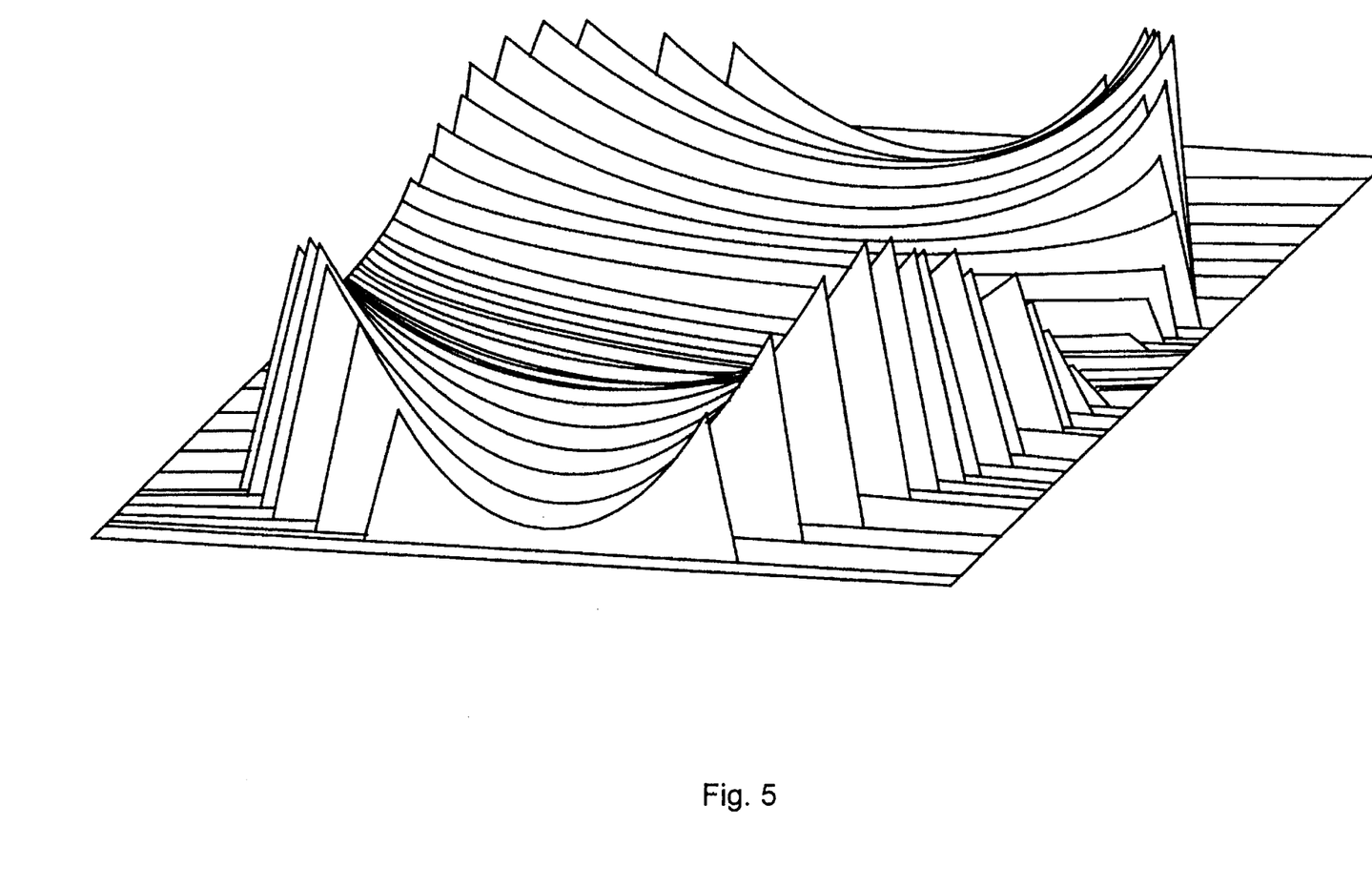

A more complete view of the wavefront aberration of the microlens pair is shown in FIG. 5. In this figure the optical path difference over the full beam is displayed. As can be seen in the figure, although the aberrations along the two transverse axes are very small, the aberrations along the diagonals are substantially greater, although still well below the diffraction limit. The maximum peak-to-valley aberration shown here is 0.02 waves.

Similarly, it has been shown that the aberrations are not significantly affected by tuning the microlens external cavity. For example, tuning 1 µm from best focus introduces less than ½ waves (peak to valley) of astigmatism, well below the diffraction limit of ¼ waves. (Note: tuning of the microlens cavity only requires a total motion of one wavelength, i.e. 780 nm.) Since the beam remains diffraction-limited even if tuned, tuning does not have a measurable effect on the laser beam quality.

Figure 6:
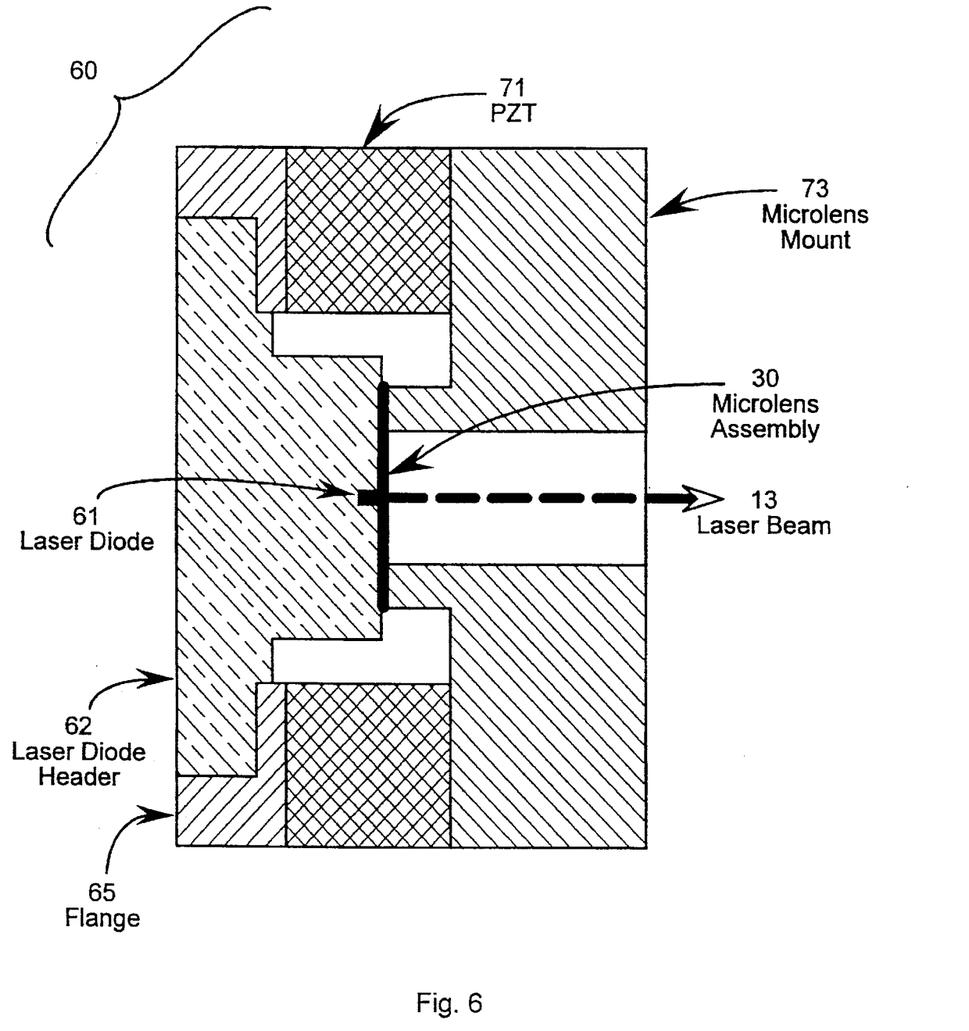
FIG. 6 shows a side view of a compact tunable laser diode assembly in accordance with the invention.

Shown in FIG. 6, is a cutaway view of a preferred embodiment of a microlens tunable laser diode assembly 60 according to the invention which is both rugged and compact. In one embodiment, the optical assembly 30 is rigidly attached to an annular microlens mount 73. Mount 73 is rigidly mounted to a washer-shaped PZT structure 71 that provides the necessary translational range for mode selection and/or frequency tuning. PZT structure 71, for example can be made of ceramic disks or tubes. Laser diode 61 has a header/heatsink 62 which is attached to a flange 65. The flange 65 is also attached to the PZT structure 71 opposite the microlens mount 73. The alignment of tile microlens assembly to the laser diode assembly requires significant accuracy. This is accomplished by applying epoxy between the microlens mount 73 and the PZT 71, and actively aligning the assembly before the epoxy cures. The active alignment is accomplished using the WaveAlyzer beam profiler from Melles Griot to diagnose the laser beam aberration, in the manner that is presently used to mount microlenses directly to laser diodes. Jack screws can also be used on the microlens mount 73 to accurately and rigidly define the separation. As an example of the size of the structure, the distance from the back of the diode 61 to the output side of the microlens mount 73 is less than 1 cm.

Figure 7:
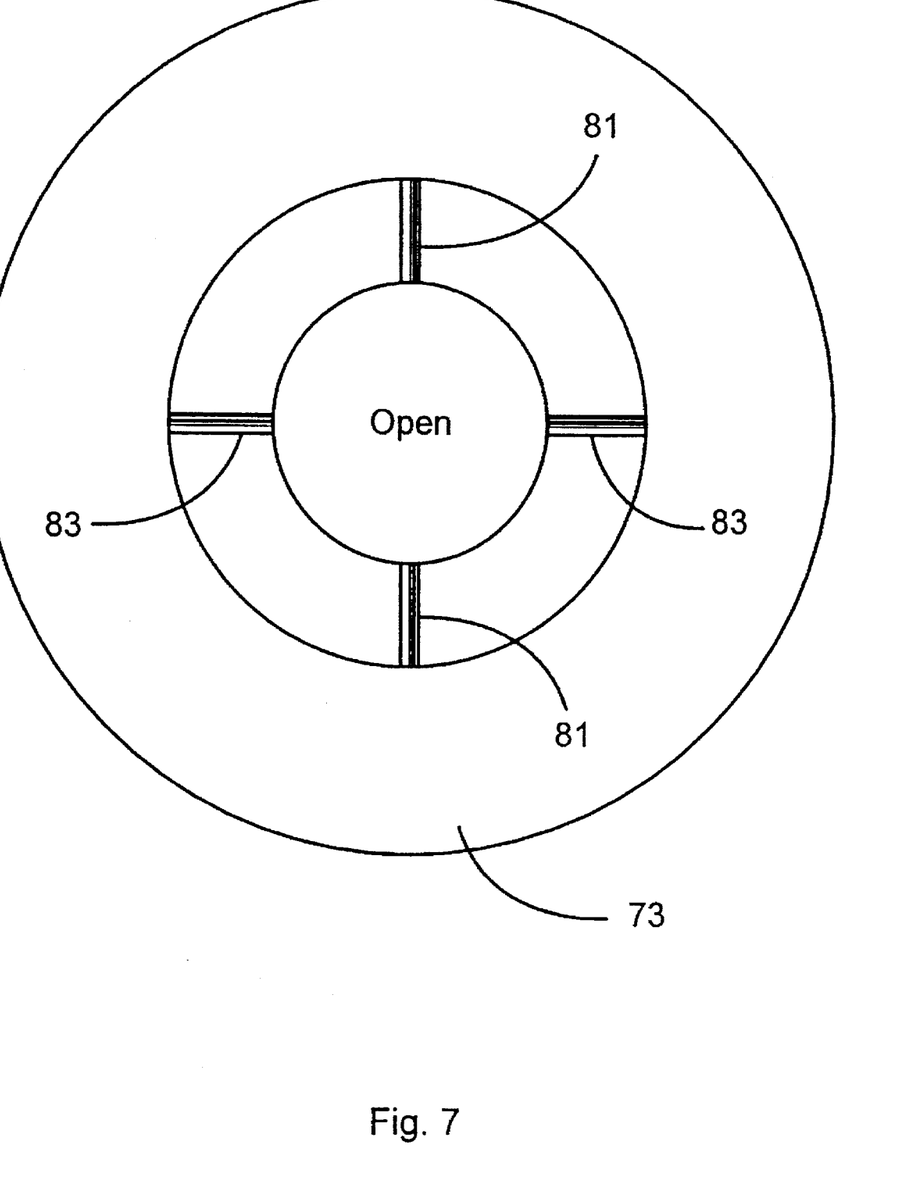
FIG. 7 shows an alternative configuration of a microlens mount useful in the embodiment depicted in FIG. 6.

In another embodiment, the annular spacer 29 in optical assembly 30 can be eliminated. In this embodiment, the annular microlens mount 73 uses two orthogonal grooves 81 and 83 shown in FIG. 7 which are precision machined for properly spacing and orienting the two microlenses. The microlenses are glued directly to the mount 73, then the mount is attached to the PZT 71 just as in the previous embodiment.

Although the previous descriptions have concentrated on pairs of microlenses, those skilled in the art will also realize that lens 17 in conjunction with a laser diode is also useful in and of itself, ie. without the second microlens. For example, in the arrangement shown in FIG. 2, if the microlens is attached to the laser diode such that the surface 19 is located at the focal distance from the diode, or if it is held in that position some other way, the feedback from reflections off surface 21 which has a reflective coating can be used to prevent mode hopping. Such a system is useful for laser stabilization, even if the microlens is not used for tuning the diode.

EXPERIMENTAL DESCRIPTION

The relationship of the microlens cavity size and reflectivity to the laser diode tuning range has been investigated, and the effect on beam quality of tuning the microlens cavity by translating the microlens pair along the optic axis has been determined. The effects of feedback from samples of three standard semi-collimating microlenses designated SAC800, SAC850, and SAC900 have been measured. These microlenses are available off the shelf from Blue Sky Research, Inc. of San Jose, Calif. Because these microlenses are diffraction limited and very fast, having numerical apertures ranging from 0.56 to 0.73, they are able to collect and collimate the radiation from the strongly divergent laser diode with high efficiency. The three microlenses have different thicknesses and focal lengths, so that optical cavities formed by them have different optical path lengths. The characteristics of the three microlenses and the cavities they form are summarized in Table I. A cross-sectional view of a typical SAC microlens is shown in FIG. 2.

TABLE I

| Designation | Focal Length | Thickness | Index of Refraction | Cavity Length |
|---|---|---|---|---|
| SAC800 | 50 | 600 | 1.6091 | 1015 |
| SAC850 | 25 | 150 | 1.6091 | 266 |
| SAC900 | 110 | 300 | 1.6091 | 593 |

Table I shows the characteristics of the investigated microlenses and the external cavities formed with them. All dimensions are in µm. The index of refraction value is that of F2 glass at 780 nm.

The continuous tuning range of a Sharp LTO24MDO laser diode was investigated under feedback from SAC800, SAC850 and SAC900 microlenses when AR coated on each surface (1% reflectivity), AR coated on the near (convex) face and uncoated (6% reflectivity) on the flat face, or AR coated on the near face and 35% coated on the flat reflecting face. With the 35% /AR SAC850 lens, a maximum of 38±1 GHz of tuning has been achieved.

The LTO24MDO is an AlGaAs laser diode with an output wavelength of 780 nm and a nominal output power of 20 mW with 60 mA of driving current. These commercial lasers are housed in a hermetically sealed can which has been removed in order to provide access to the laser diode facet. The laser header was mounted to an aluminum plate which was temperature controlled to 20.00±0.01 C. A highly stable drive current was provided by rechargeable gel cell batteries.

Figure 8:
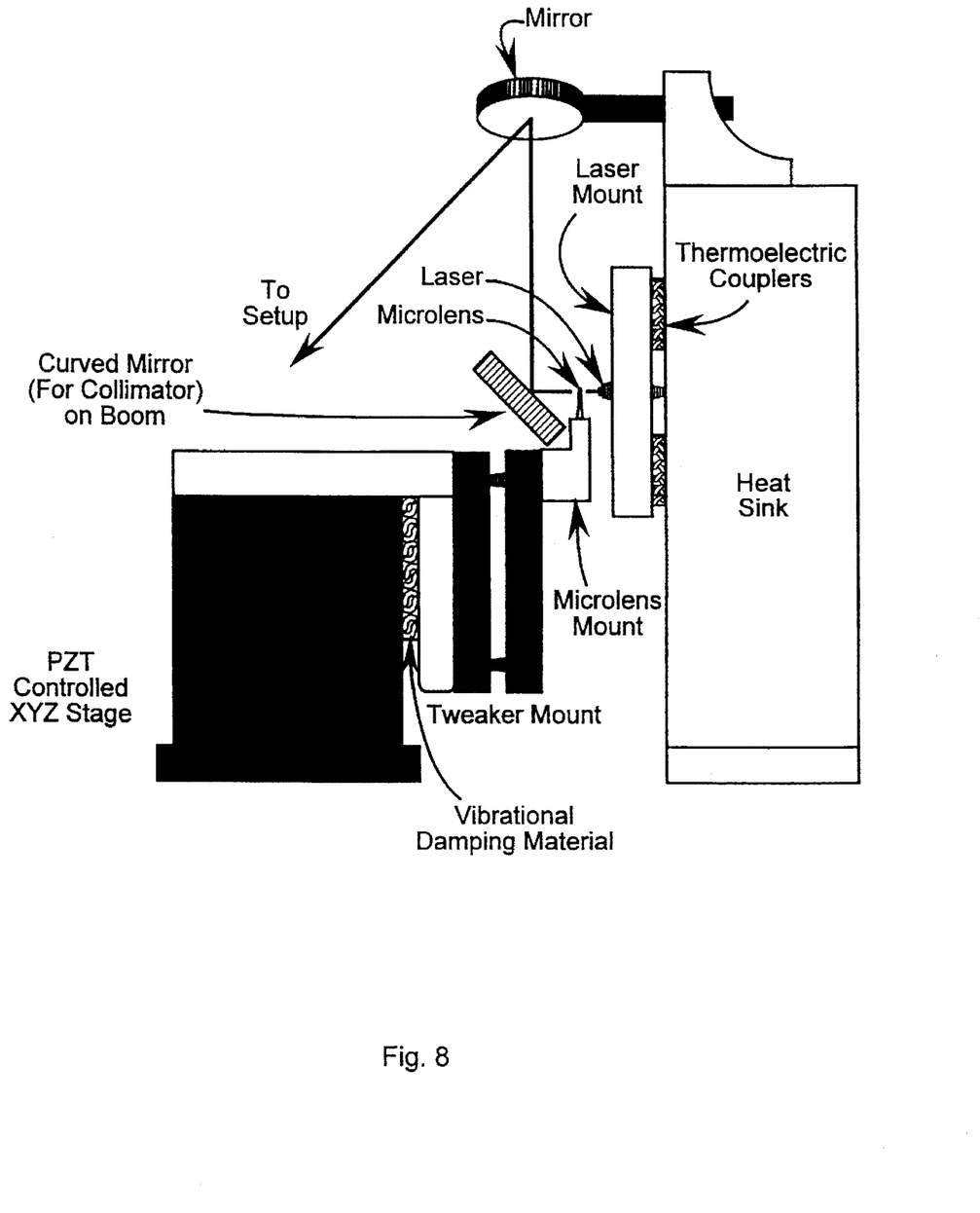
FIG. 8 is a diagram showing a laser and microlens mounts used in measuring external cavity parameters of a diode laser.
Figure 9:
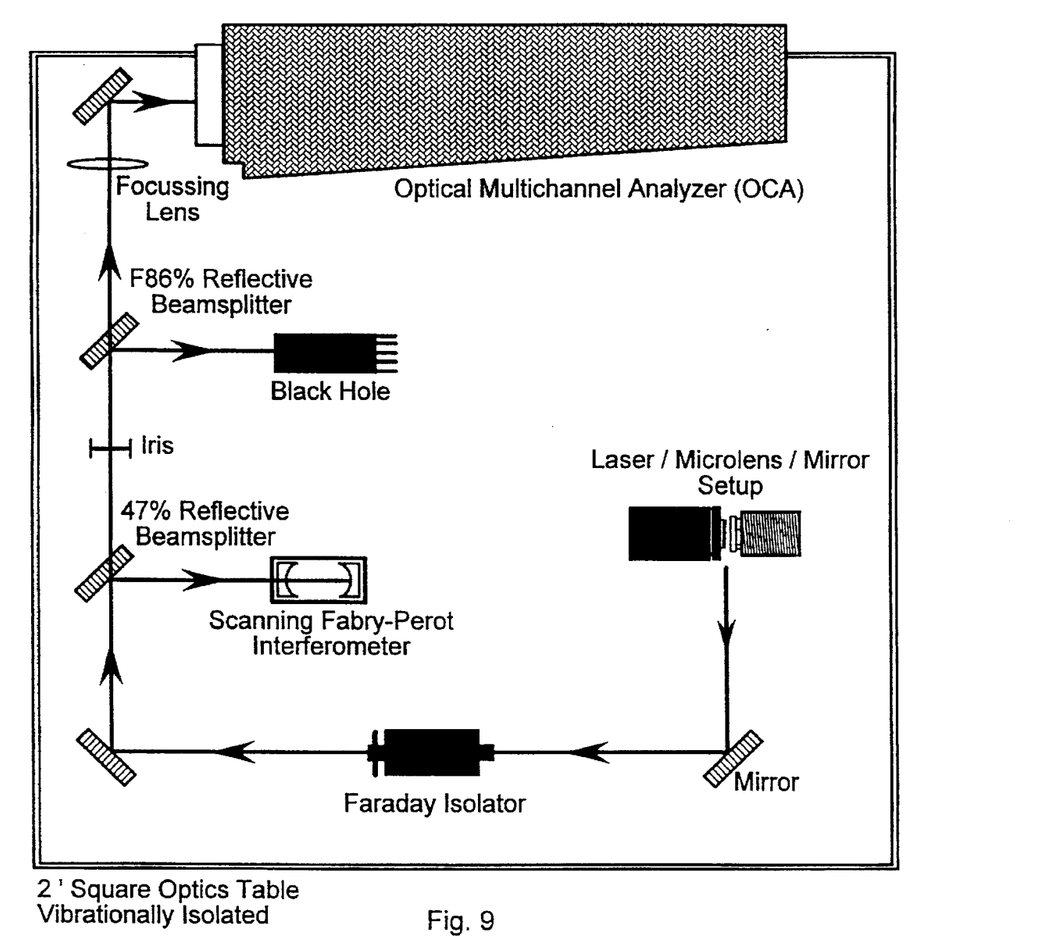
FIG. 9 is diagram showing an experimental setup for measuring external cavity parameters of a diode laser.

In order to accurately align a microlens in front of a laser diode the diode was mounted on a stage which provided coarse but stable control of the X, Y, and Z position as well as two angles of rotation. Fine control of the lens' position was achieved with a PZT-controlled XYZ translation stage. A diagram of the laser and microlens mounts is shown in FIG. 8, and the overall experimental setup is shown in FIG. 9.

Optimal feedback was achieved by grossly adjusting the 5 degrees of freedom of the diode stage until the microlens was parallel to the laser junction and the strongly divergent axis of the beam (the axis normal to the laser junction) was collimated. Fine adjustments of the microlens' position were then made with the PZT controls until the amount of light detected by the laser's internal (to the package) photodetector was maximized.

For the measurements presented here, only a single microlens was employed with each laser diode, which provided collimation of the laser light in only one dimension. Collimation in the other dimension, which was necessary in order to efficiently couple the light into the spectrum analyzer, was obtained by reflection from a macroscopic cylindrical mirror, as shown in FIG. 8.

Figure 10:
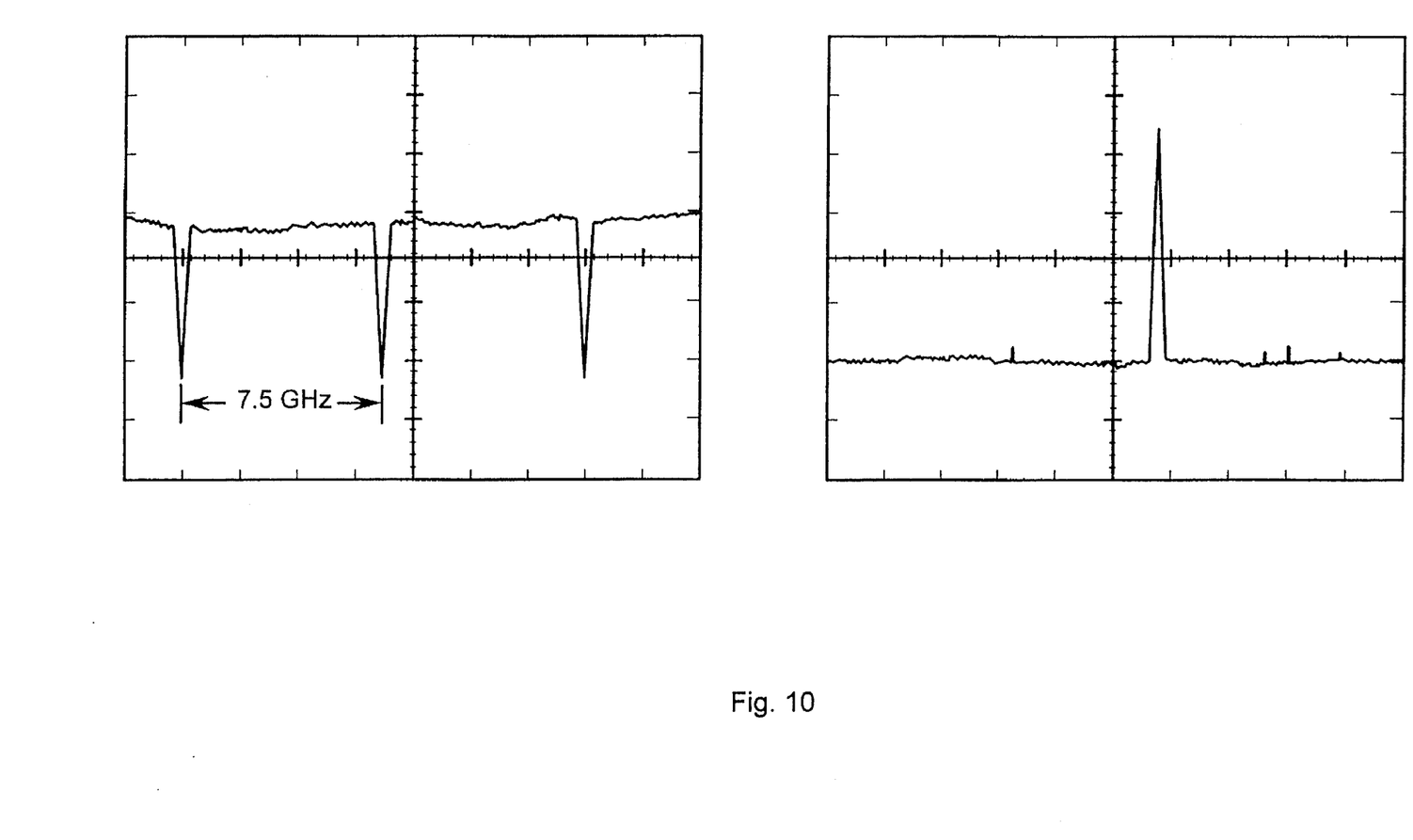
FIG. 10 is a graph showing the output from a Fabry-Perot spectrum analyzer and an OMA in the experimental setup shown in FIG. 9.

The laser diode frequency was affected by light reflected from the flat surface of the microlens back into the laser. The phase of the retroreflected light was varied by varying the distance of the lens from the laser. This change in phase causes the laser frequency to shift (or "pull") by some fraction of the laser's mode spacing (about 150 GHz, or 0.3 nm). As the distance from the laser to the microlens was varied via the PZT controls, the frequency output of the laser was monitored by a scanning Fabry-Perot with a FSR of 7.5 GHz, and an optical multichannel analyzer (OMA). A Fabry-Perot was used to measure the continuous frequency tuning by observing the laser spectrum shift on an oscilloscope. The OMA provided observation of frequency jumps larger than the FSR of the Fabry-Perot. Typical outputs of the Fabry-Perot and the OMA are displayed in FIG. 10. The single mode of the laser output is shown repeated every FSR of the Fabry-Perot. The tuning ranges are a measure of how far the laser smoothly and continuously tuned before it mode hopped.

Since the goal was to study the effect of feedback from the microlens on the laser diode's output, care was taken to prevent optical feedback from other surfaces back into the laser. This optical isolation was achieved with a Faraday polarizing isolator which provides an isolation of about 35 dB. The Fabry-Perot spectrum analyzer was the major source of additional feedback. An additional 14 dB of isolation of the Fabry-Perot was achieved by sending in only 4% of the laser output. It was found that this amount of isolation was sufficient since the feedback was dominated by that from the microlens external cavity.

Using this arrangement, a maximum of 37.5 GHz of uninterrupted tuning was observed with the 35% feedback reflectivity SAC850 microlens, and 20 GHz for the uncoated (5.5% reflectivity) SAC850 microlens. This compares with an estimated maximum tuning range of about 100 GHz for 35% reflectivity, and about 40 GHz for 5.5% reflectivity.

The other results can be summarized as follows: With the uncoated 1015 µm cavity (SAC800), approximately 6 GHz of tuning was regularly achievable, but the addition of the 35% coating only doubled this. The 593 µm cavity (SAC900) averaged around 5 GHz of tuning; the 35% coating doubled this as well, but this still gave only 10 GHz tunability. It was the 266 µm (SAC850) cavity which showed the most promise: 10–20 GHz of tuning was usually seen when uncoated, and 38 GHz with a 35% reflectivity coating. This compares with the theoretically predicted tuning range of 40 GHz for the uncoated microlens, and 100 GHz for the coated microlens.

The limits and repeatability of the tuning range are sensitive functions of mechanical vibration and the fineness of the tuning, so it was expected that tuning ranges closer to those calculated may be achievable using more stable, higher resolution translators.

Figure 11:
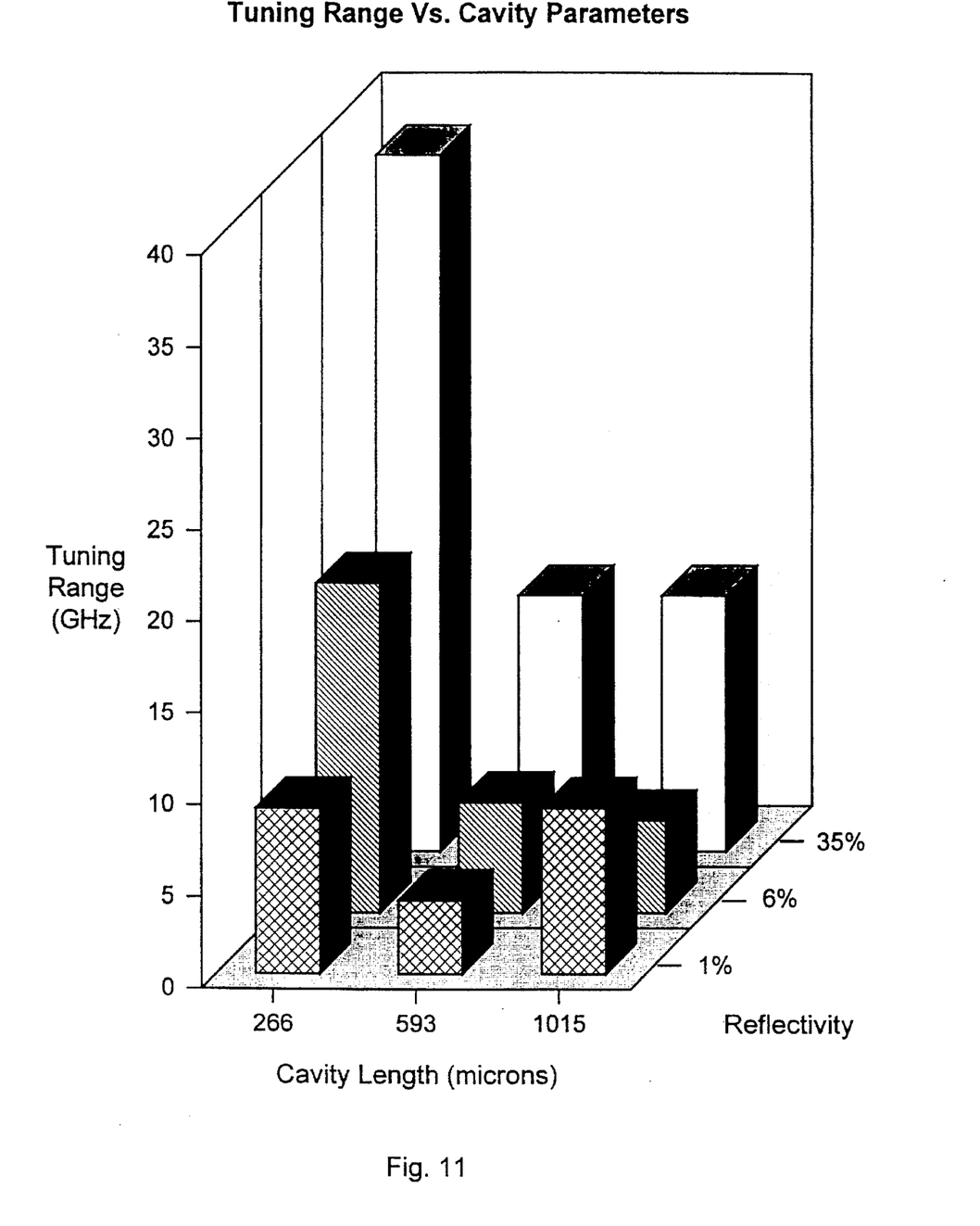
FIG. 11 is a graph which summarizes the results of the experimental measurements of the tuning range of a laser diode with an external microlens cavity for various cavity lengths and reflectivities.

In FIG. 11 the results are summarized. This graph summarizes the experimental measurements of the tuning range of the laser diode with an external microlens cavity for various cavity lengths and reflectivities. Although the 266 μm cavity with 35% reflection was clearly the most effective, the other cavities and reflectivities all demonstrated multi-GHz tuning ranges. Prior work has suggested that for longitudinal mode selection applications, a 2 GHz pulling range should be sufficient to permit a laser diode to be tuned to any wavelength within its gain spectrum.

In addition to the large tuning ranges it was observed that, as expected, the (longitudinal) side modes of the laser are better suppressed by the feedback from the microlens. This lends further support to the predicted effectiveness.

This experimental description is based upon work supported by the National Science Foundation under award number III-9361314.

What is claimed is:

1. A tunable laser comprising:

a laser diode having an optic axis and first and second axes orthogonal to said optic axis, wherein radiation from said laser diode expands more quickly along said first axis than along said second axis;

a microlens assembly comprising:

a first cylindrical microlens configured for collimating radiation emitted by said laser diode on said first axis, said first cylindrical microlens having a longitudinal axis along said second axis, wherein said first cylindrical microlens has a first optical surface and a second optical surface opposite said first optical surface, wherein said first optical surface is convex and is oriented for receiving radiation from said laser diode and wherein said second optical surface is flat and is oriented for receiving radiation from said first optical surface, said second optical surface for reflecting a portion of the radiation from said laser diode back through said first surface along said optic axis toward said laser diode;

a second cylindrical microlens spaced apart from said first microlens, orthogonal thereto, and configured for circularizing radiation incident from said first microlens;

a holder for holding said first cylindrical microlens and said second cylindrical microlens in said spaced apart arrangement to accomplish said circularization by said second microlens;

a translation element coupled to said laser diode and to said microlens assembly such that said microlens assembly can be translated along the optic axis relative to said laser diode, thereby changing the frequency of radiation emitted by said laser diode.

2. A tunable laser as in claim 1 wherein said second surface of said first cylindrical microlens has a reflective coating.

3. A tunable laser as in claim 1 wherein said holder comprises an annulus with two orthogonal grooves having longitudinal axes passing through the open portion of said annulus, said grooves being of different depths, and configured such that when said first microlens is placed in one groove and said second microlens is placed in the other groove, the first and second microlenses are spaced apart.

4. A laser that is inhibited from mode hopping, comprising:

a laser diode having an optic axis and first and second axes orthogonal to said optic axis;

a first cylindrical microlens spaced apart from said laser diode and configured for collimating radiation emitted by said laser diode on said first axis and having a flat surface for reflecting a portion of the radiation from said laser diode back along said optic axis toward said laser diode, wherein said first cylindrical microlens has a longitudinal axis which is orthogonal to the optic axis, and wherein said first cylindrical microlens has a first optical surface and a second optical surface opposite said first optical surface, wherein said first optical surface is convex and is oriented for receiving radiation from said laser diode and wherein said second optical surface is said flat surface and is oriented for receiving radiation from said first optical surface, and wherein said second surface has a reflective coating.

* * * * *